(12) United States Patent
Miura et al.

(10) Patent No.: US 7,213,218 B2
(45) Date of Patent: May 1, 2007

(54) SIMULATION MODEL FOR DESIGN OF SEMICONDUCTOR DEVICE, THERMAL DRAIN NOISE ANALYSIS METHOD, SIMULATION METHOD, AND SIMULATION APPARATUS

(75) Inventors: Mitiko Miura, Higashihiroshima (JP); Hiroaki Ueno, Higashihiroshima (JP); Satoshi Hosokawa, Kure (JP)

(73) Assignee: Semiconductor Technology Academic Research Center, Yokohama-shi (JP)

( * ) Notice: Subject to any disclaimer, the term of this patent is extended or adjusted under 35 U.S.C. 154(b) by 228 days.

(21) Appl. No.: 11/009,094

(22) Filed: Dec. 13, 2004

(65) Prior Publication Data

US 2005/0155004 A1 Jul. 14, 2005

(30) Foreign Application Priority Data

Dec. 18, 2003 (JP) ............................. 2003-420845

(51) Int. Cl.
*G06F 17/50* (2006.01)
(52) U.S. Cl. .................................... 716/4; 716/5; 716/6
(58) Field of Classification Search .................. 716/4–6
See application file for complete search history.

(56) References Cited

U.S. PATENT DOCUMENTS 5,687,355 A * 11/1997 Joardar et al. ................ 716/20
5,761,082 A * 6/1998 Miura-Mattausch .......... 703/14
6,714,027 B1 * 3/2004 Lui et al. ..................... 324/719

OTHER PUBLICATIONS

Tsividis, Y.; Masetti, G. "Problems in Precision Modeling of the MOS Transistor for Analog Applications"; Computer-Aided Design of Integrated Circuits and Systems, IEEE Transactions; Jan. 1984 pp. 72-79.*
Derek K. Shaeffer, et al., "A 1.5-V, 1.5-GHz CMOS Low Noise Amplifier", IEEE Journal of Solid-State Circuits, vol. 32, No. 5 May 1997, pp. 745-759.
H. Nyquist., "Thermal Agitation of Electric Charge in Conductors", Physical Review, vol. 32, Jul. 1928, pp. 110-113.

(Continued)

*Primary Examiner*—Thuan Do
*Assistant Examiner*—Naum Levin
(74) *Attorney, Agent, or Firm*—Oblon, Spivak, McClelland, Maier & Neustadt, P.C.

(57) ABSTRACT

A semiconductor device simulation method includes the step of storing, in a storage unit, a surface potential and threshold voltage obtained by computation, the step of computing thermal drain noise on the basis of the data of the surface potential and thermal drain noise stored in the storage unit, and the step of determining whether or not to reduce thermal drain noise, and reflecting the computation result in simulation of the model when it is determined that thermal drain noise is to be reduced. A drain current $I_{ds}$ of a MOSFET is calculated and substituted into a relational expression for a drain current noise spectrum density obtained from a Nyquist theorem equation, thereby calculating a thermal drain noise coefficient γ of the MOSFET by substituting the current $I_{ds}$ into a relational expression for a thermal drain noise spectrum density which is obtained from the Nyquist logical equation.

2 Claims, 5 Drawing Sheets

OTHER PUBLICATIONS

R. P. Jindal., "Hot-Electron Effects on Channel Thermal Noise in Fine-Line NMOS Field-Effect Transistor", IEEE Transactions on Electron Devices, vol. ED-33, No. 9, Sep. 1986, pp. 1395-1397.

Gerhard Knoblinger., "A New Model for Thermal Channel Noise of Deep-Submicron MOSFETS and its Application in RF-CMOS Design", IEEE Journal of Solid-State Circuits, vol. 36, No. 5, May 2001, pp. 831-836.

Y. Tsivids., "Operation and Modeling of the MOSFET Transistor", The Mos Transistor in Dynamic Operation-Large Signal Modeling, 1999, pp. 325-331.

A. J. Scholten, et al., "Compact modeling of drain and gate current noise for RF CMOS", IEDM, 2002, pp. 129-132.

\* cited by examiner

F I G. 1 (PRIOR ART)

Increase in thermal noise with reduction in size

F I G. 2 (PRIOR ART)

Linear approximation of change in mobility within channel

FIG. 4 Comparison in spectrum density between actual measurements and simulation results

SIMULATION MODEL FOR DESIGN OF SEMICONDUCTOR DEVICE, THERMAL DRAIN NOISE ANALYSIS METHOD, SIMULATION METHOD, AND SIMULATION APPARATUS

CROSS-REFERENCE TO RELATED APPLICATIONS

This application is based upon and claims the benefit of priority from prior Japanese Patent Application No. 2003-420845, filed Dec. 18, 2003, the entire contents of which are incorporated herein by reference.

BACKGROUND OF THE INVENTION

1. Field of the Invention

The present invention relates to a simulation model for the design of a semiconductor device which is used to estimate thermal drain noise from the DC characteristics of a MOSFET, a thermal drain noise analysis method using the model, and a simulation method and apparatus which simulate the electrical characteristics or circuit operation of a semiconductor device on a computer by means of the model.

2. Description of the Related Art

Figure 1:
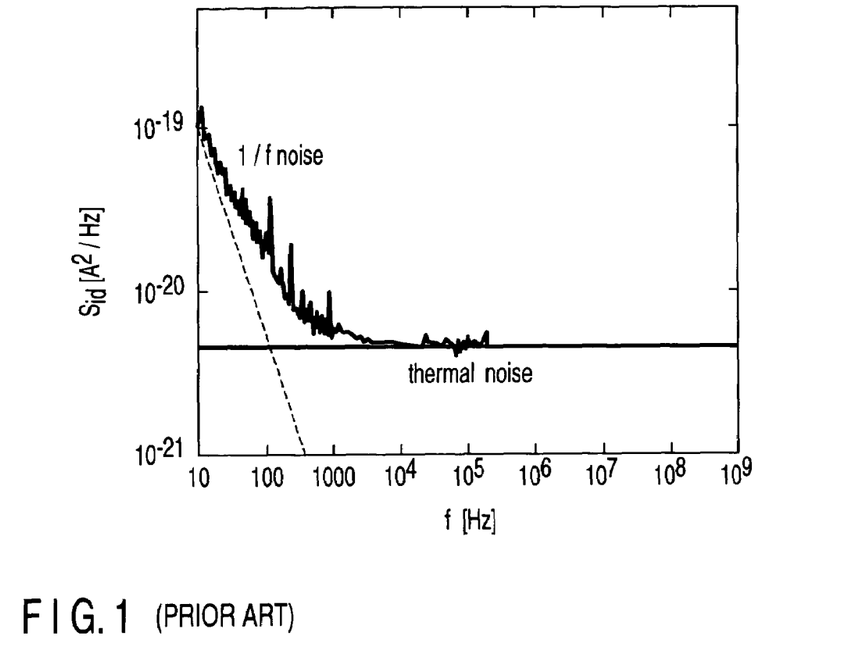
FIG. 1 is a graph showing the relationship between the frequency and the drain current noise spectrum density in a MOSFET formed by a 100-nm microfabrication technique.

With the recent advances in high integration techniques for semiconductor devices such as ICs and LSIs, the generation of noise has become a serious problem as MOSFETs have been reduced in size. FIG. 1 shows the relationship between a frequency f and a drain current noise spectrum density $S_{id}$ in MOSFETs manufactured by a 100-nm microfabrication technique. As shown in FIG. 1, 1/f noise (noise exhibiting a spectrum distribution almost inversely proportional to a frequency; also called flicker noise) is observed in a low-frequency region, whereas thermal noise (electrical noise caused by thermal agitation of electrons) is observed in a GHz band of high frequencies. 1/f noise and thermal noise are caused by physically different mechanisms. Of such noise, 1/f noise is relatively large and hence can be measured by a conventional DC test technique. Thermal noise is, however, small and hence is difficult to directly measure. For this reason, as the application of MOSFETs to radio-frequency (RF) circuits such as cellphones and wireless LANs has progressed, greater importance has been attached to countermeasures against thermal noise (see, for example, D. K. Shaeffer and T. H. Lee, "A 1.5 V 1.5 GHz CMOS low noise amplifier", IEEE J. Solid-State Circuits, vol. 32, pp. 745–759, 1997).

Figure 2:
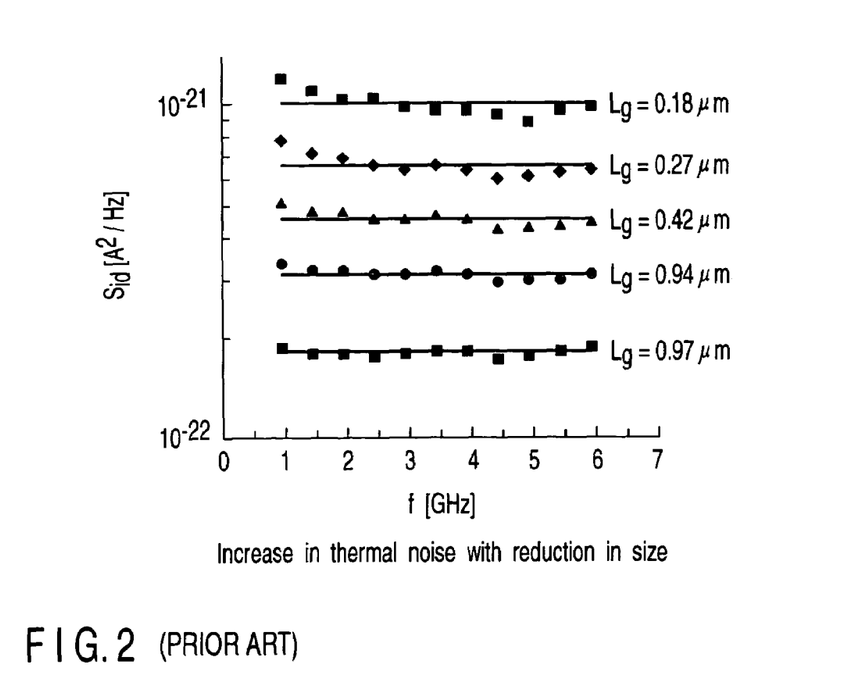
FIG. 2 is a graph showing the relationship between the frequency and the drain current noise spectrum density to explain an increase in thermal noise with a reduction in MOSFET size.

FIG. 2 shows an increase in thermal noise with a decrease in the size of MOSFETs, and more specifically, the drain current noise spectrum density $S_{id}$ [$A^2$/Hz] as a function of the frequency f [GHz] in the case of gate length $L_g$=0.18 μm, 0.27 μm, 0.42 μm, 0.94 μm, and 0.97 μm. As the gate length $L_g$ decreases, thermal noise increases. It is expected that when the gate length becomes smaller than 0.18 μm, thermal noise will increase more.

Noise generated in a circuit is one parameter that causes a deterioration in circuit characteristics. In designing a circuit, therefore, it is necessary to accurately predict noise by circuit simulation.

Conventionally, such noise is calculated as γ=2/3 by using the relational expression $S_{id}$=4 $kTg_{ds0}$γ for the drain current noise spectrum density $S_{id}$ which is obtained from the Nyquist theorem equation (see H. Nyquist, Phys. Rev., 32, 110, 1928, "Thermal Agitation of Electric Charge in Conductors").

That is, thermal noise is caused by heat, and the noise spectrum density per unit frequency is constant without exhibiting frequency dependence. This thermal noise has been theoretically explained by Nyquist, and its general expression is:

$$S_V = 4kTR [V^2/Hz]$$

$$S_I = 4kTG [A^2/Hz] \quad (1)$$

where $S_V$ is the voltage noise spectrum density, $S_I$ is the current noise spectrum density, k is the Boltzmann constant, T is the absolute temperature, R is the resistance, and G is the conductance.

Consider the case of a MOSFET. First of all, according to expressions (1), letting Sid be the drain current noise spectrum density, a general expression can be written as follows:

$$S_{id} = 4kTg_{ds} \quad (2)$$

In the case of a MOSFET, however, since a channel conductance $g_{ds}$ depends on a bias voltage, $g_{ds}$ is fixed to the value obtained when $V_{ds}$=0, the drain current noise spectrum density is written as $$S_{id} = 4kTg_{ds0}\gamma \quad (3)$$

and γ (thermal drain noise coefficient) is used to evaluate the characteristics of thermal noise.

Since $g_{ds}$ is equal to $g_{ds0}$ when drain-source voltage $V_{ds}$=0, γ is given as γ=1 by comparing equations (2) and (3). As $V_{ds}$ increases, $g_{ds}$ decreases, and hence γ decreases. In the case of a long channel, it has been found experimentally and theoretically that 2/3< γ<1 in a linear region, and γ converges to γ=2/3 in a saturation region.

In the case of a short channel, it was found from actual measurements in R. P. Jindal, IEEE Trans. Elec. Dev. 1986, "Hot-Electron Effects on Channel Thermal Noise in Fine-Line NMOS Field-Effect Transistors" that γ increases to 1 or more. Although the cause for an increase in γ has not been theoretically explained, it is thought, according to G. Knoblinger, P. Klein, M. Tiebout, IEEE J. Solid-State Circuits, 2001, "A New Model for Thermal Channel Noise of Deep Submicron MOSFET's and its Application in RF-CMOS Design", that the hot carrier effect is the cause.

As described above, since the value of thermal drain noise coefficient γ actually takes a value ranging from 2/3 to 1, circuit simulation cannot be accurately performed by calculation with γ=2/3.

According to one technique for solving this problem, thermal noise is measured under different bias conditions as in the case of a DC model, and γ is handled as a parameter. As described above, however, thermal noise is small and difficult to measure, and it takes much time to measure it. In addition, since an apparatus for such measurement is not generally used as compared with that for DC measurement, it is difficult to obtain a parameter on the basis of the measurement result on thermal noise.

Under the circumstances, demand has arisen for the development of a MOSFET model which allows high-precision estimation of thermal noise without direct measurement, a thermal noise analysis method, and a simulation method and apparatus which can accurately simulate the electrical characteristics or circuit operation of a semiconductor device on a computer by using a MOSFET model.

As described above, according to the conventional simulation model for the design of a semiconductor device, since calculation is performed with a fixed thermal drain noise coefficient, circuit simulation cannot be done with high precision. In order to solve this problem, thermal noise may be measured under different bias conditions, and a thermal drain noise coefficient may be handled as a parameter. It is, however, difficult to measure thermal noise, and it takes much time to measure it. It is therefore difficult to obtain a parameter on the basis of the measurement result.

Even if thermal drain noise is measured, it cannot be evaluated or analyzed.

In addition, the conventional semiconductor device simulation method and apparatus using this model cannot accurately simulate the electrical characteristics or circuit operation of a semiconductor device formed from microfabricated MOSFETs.

BRIEF SUMMARY OF THE INVENTION

It is, therefore, an object of the present invention to provide a simulation model for the design of a semiconductor device which can accurately estimate thermal noise from the DC characteristics of a MOSFET.

It is another object of the present invention to provide a thermal drain noise analysis method which can analyze a measurement result by using a thermal drain noise coefficient for the above model.

It is still another object of the present invention to provide a simulation method and apparatus which can accurately simulate on a computer the electrical characteristics or circuit operation of a semiconductor device formed from microfabricated MOSFETs by predicting thermal drain noise by using the model.

According to an aspect of the present invention, there is provided a simulation model for design of a semiconductor device, comprising:

calculating the drain current $I_{ds}$ of a MOSFET by using a surface potential model according to the following equations based on a drift-diffusion approximation:

$$I_{ds} = \frac{W_g}{L_{eff} - L_{red}} \mu C_{ox} \frac{(V_{gs} - V_{th})^2}{2(1+\delta)} (1 - \alpha^2)$$

where $W_g$ is the gate width of the MOSFET, "$L_{eff}-L_{red}$" is the distance from the source terminal to a pinch-off point, $\mu$ is the carrier mobility, $C_{OX}$ is the capacitance of the gate oxide film per unit area, $V_{gs}$ is the gate-source voltage, $V_{th}$ be the threshold voltage, $\phi_{s0}$ is the surface potential at the source terminal in a channel, $\phi_{sL}$ is the surface potential at the drain terminal in the channel, and $\delta$ is the bulk coefficient, $$\alpha = 1 - \frac{1+\delta}{V_{gs} - v_{th}}(\phi_{SL} - \phi_{S0}); \text{ and}$$

substituting the calculated drain current $I_{ds}$ into the following relational expression for a thermal drain noise spectrum density which is obtained from a Nyquist theorem equation:

$$S_{id} = \frac{4kT}{Leff^2 I_{ds}} \int g_{ds}^2(\phi_s) d\phi_s$$

where k is the Boltzmann constant, T is the absolute temperature, $L_{eff}$ is the effective channel length of the MOSFET, $g_{ds}$ is the channel conductance, and $\phi_s$ is the silicon surface potential, thereby calculating an equation effective for all voltage conditions which is expressed as $$\gamma = \frac{\int g_{ds}^2(\phi_s) d\phi_s}{L_{eff}^2 * I_{ds} * g_{ds0}}$$

Thermal drain noise can be accurately and quickly calculated for all operating voltages by using this simulation model.

In addition, the present invention is characterized in that the simulation model for the design of a semiconductor device is incorporated into a circuit simulator, and a measurement result is analyzed from the thermal drain noise coefficient $\gamma$.

In addition, the present invention is characterized in that the simulation model for the design of a semiconductor device is incorporated into a circuit simulator, and thermal drain noise is predicted.

According to an aspect of the present invention, there is provided a semiconductor device simulation method, which includes a first step of inputting a device parameter for a MOSFET, a second step of setting a voltage for the MOSFET, a third step of computing a surface potential and a threshold voltage of the MOSFET on the basis of the device parameter input in the first step and the set voltage input in the second step, a fourth step of computing a device characteristic of the MOSFET on the basis of the calculated surface potential and threshold voltage, a fifth step of determining whether or not to change a voltage setting in the MOSFET, and a sixth step of determining whether or not to change the device parameter for the MOSFET, the third to fifth steps being repeated upon returning to the second step to change the voltage setting when it is determined in the fifth step that the voltage setting is to be changed, and the second to sixth steps being repeated upon returning to the first step to change the device parameter when it is determined in the fifth step that the voltage setting is not to be changed and it is determined in the sixth step that the device parameter is to be changed, the semiconductor device simulation method further comprising a seventh step of storing, in storage means, the surface potential and threshold voltage obtained by computation in the third step, an eighth step of computing thermal drain noise on the basis of data of the device parameter input in the first step, the set voltage input in the second step, and the surface potential and threshold voltage stored in the storage means; and a ninth step of determining whether or not to reduce thermal drain noise in the MOSFET, and transferring a computation result of thermal drain noise to the fifth step to reflect the result in thermal noise simulation using the model when it is determined that the thermal drain noise is to be reduced, the eighth step including calculating thermal drain noise by using the simulation model (MOSFET model) for design of a semiconductor device.

Furthermore, according to an aspect of the present invention, there is provided a semiconductor device simulation apparatus comprising input means for inputting a device parameter and a set voltage, processing means for performing computation of a surface potential and a threshold voltage, computation of a device characteristic, and computation of thermal drain noise on the basis of the device parameter and set voltage input from the input means, storage means for storing the device parameter and set voltage input from the input means, a program describing an operational expression for the drain current of a MOSFET in a surface potential model, a program describing a relational expression for a thermal drain noise spectrum density which is obtained from a Nyquist theorem equation, a program describing an operational expression for the thermal drain noise coefficient, and a computation result obtained by the processing means, and output means for outputting the computation result obtained by the processing means, wherein the processing means uses the simulation model (MOSFET model) for design of a semiconductor device to compute thermal drain noise.

According to the above method and apparatus, thermal drain noise can be predicted, estimated, analyzed, and evaluated with high precision from the DC characteristics of a MOSFET without measuring thermal noise under different bias conditions or performing approximation using fitting parameters.

In addition, the electrical characteristics or circuit operation of a semiconductor device formed from microfabricated MOSFETs can be simulated on a computer by means of the above model.

A semiconductor device with little thermal drain noise can therefore be manufactured by adjusting various device parameters and set voltages in MOSFETs while reflecting this MOSFET model and a simulation result in device design.

DETAILED DESCRIPTION OF THE INVENTION

A simulation model for the design of a semiconductor device will be described first. An example of a simulation method and apparatus which use this simulation model will be described next.

(A) Derivation of Basic Equation for Thermal Drain Noise

First of all, a basic equation is derived from a thermal noise model based on the H. Nyquist theorem (H. Nyquist, Phys. Rev., 32, 110, 1928, "Thermal Agitation of Electric Charge in Conductors"):

$$S_{id} = \frac{1}{L^2} \int_0^L 4kT g_{ds}(x) dx \qquad (4)$$

In a MOSFET, letting $\phi_s$ be the potential at a distance x from a source terminal, and $g_{ds}(x)$ be the small channel conductance, $g_{ds}(x)$ can be expressed in terms of a function $g_{ds}(\phi_s)$ of $\phi_s$. Since the drain current is expressed as $$I_{ds} = g_{ds}(\phi_s) \frac{d\phi_s}{dx} \qquad (5)$$

the integration of the two sides within the channel yields $$I_{ds} = \frac{1}{L} \int_{\phi_{sO}}^{\phi_{sL}} g_{ds}(\phi_S) d\phi_S \qquad (6)$$

where $\phi_s 0$ and $\phi_s L$ represent the surface potentials at the source terminal and drain terminal in the channel.

According to equation (5) as a current equation, the conversion of the variable of equation (4) from x to $\phi_s$ yields $$S_{id}(f) = \frac{4kT}{L^2 I_{ds}} \int_{\phi_{sO}}^{\phi_{sL}} g_{ds}^2(\phi_S) d\phi_S \qquad (7)$$

In this case, since $S_{id}(f) = 4kT g_{d0} \gamma$ $$\gamma = \frac{1}{L^2 I_{ds} g_{ds0}} \int_{\phi_{sO}}^{\phi_{sL}} g_{ds}^2(\phi_S) d\phi_S \qquad (8)$$

According to the above description, $S_{id}$ and $\gamma$ can be derived.

(B) Application to a MOSFET

As described above, in order to simulate γ calculated in the above manner with a surface potential model, e.g., HiSIM (Hiroshima University STARC IGFET Model), the integration of equation (8) is performed by using a current equation rewritten to be effective for all operating voltages.

Figure 3:
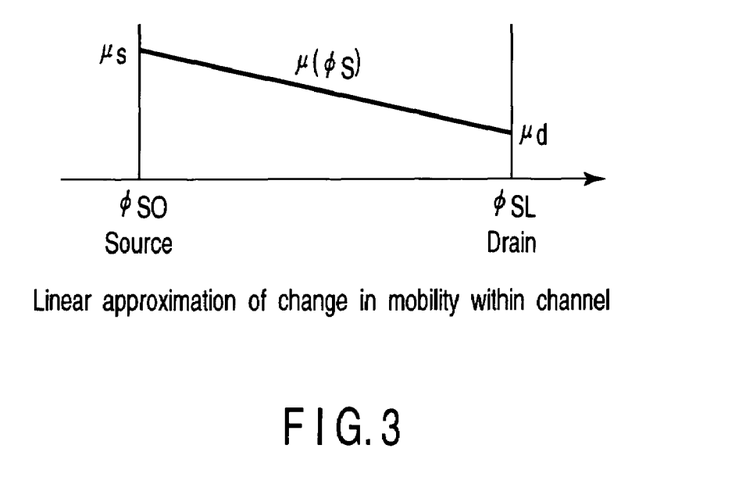
FIG. 3 is a graph expressing a change in carrier mobility with a change in potential in a channel by a linear approximation.

In this case, a change in carrier mobility due to the potential in the channel is expressed as, for example, a linear approximation (see FIG. 3). Letting $\mu_d$ be the carrier mobility at the drain terminal, and $\mu_s$ be the carrier mobility at the source terminal, a linear approximation of the carrier mobility with respect to a change in potential is expressed by the following equation:

$$\mu(\phi_S) = \frac{\mu_d - \mu_s}{\phi_{SL} - \phi_{sO}} (\phi_s - \phi_{sO}) + \mu_s \qquad (9)$$

First of all, the current equations are expressed as equations (10) in accordance with the description of a surface potential model based on a drift-diffusion approximation.

$$I_{ds} = \frac{W_g}{L_{eff} - L_{red}} \mu\, C_{ox} \frac{(V_{gs} - V_{th})^2}{2(1+\delta)}(1-\alpha^2) \qquad (10)$$

$$\alpha = 1 - \frac{1+\delta}{V_{gs} + V_{th}}(\phi_{sL} - \phi_{s0})$$

In this case, $L_{eff}-L_{red}$ represents the distance from the source terminal to the pinch-off point, and $\delta$ is generally termed a bulk coefficient, which is based on a drift-diffusion approximation and hence results in a complicated function.

Equations (10) are obtained by modifying the surface potential based on the drift-diffusion approximation, and are expressed in the form of a drift model disclosed in, for example, Y. P. Tsivids, "Operation and modeling of the MOS transistor", McGraw-Hill, 1999.

Note, however, the $V_{th}$ and $\delta$ are respectively expressed by equations (11) and (12):

$$V_{th} = V_{fb} + \phi_{s0} + \frac{const0}{C_{ox}} BPS0^{\frac{1}{2}} - \frac{1}{\beta} \qquad (11)$$

$$\delta = 2\left\{ \frac{\frac{(const0 - BC)}{C_{ox}}\frac{2}{3}\frac{1}{\beta}\left(BPSL^{\frac{3}{2}} - BPS0^{\frac{3}{2}}\right)}{P0^2} - \right.$$

$$\frac{\frac{(const0 - BC)}{C_{ox}}\frac{1}{\beta}\left(BPSL^{\frac{1}{2}} - BPS0^{\frac{1}{2}}\right)}{P0^2} -$$

$$\left. \frac{\frac{(const0 - BC)}{C_{ox}}BPS0^{\frac{1}{2}}P0}{P0^2} \right\}$$

for $$const0 = \sqrt{\frac{2qN_{sub}\varepsilon_{si}}{\beta}} \qquad (12)$$

$$BPS0^{\frac{n}{2}} = (\beta(\phi_{s0} - V_{bs}) - 1)^{\frac{n}{2}}$$

$$BPSL^{\frac{n}{2}} = (\beta(\phi_{sL} - V_{bs}) - 1)^{\frac{n}{2}}$$

$$\beta = \left(\frac{kT}{q}\right)^{-1}$$

$$P0 = \phi_{sL} - \phi_{s0}$$

where q is the elementary electric charge quantity, $N_{sub}$ is the substrate density, $\varepsilon_{si}$ is the dielectric constant of silicon, $\beta$ is the thermal voltage, and $V_{bs}$ is the bulk-source voltage.

In this case, in performing modeling, a change in carrier mobility in the channel is expressed as, for example, a linear approximation. This approximation, however, can be improved in accordance with an actual change in carrier mobility in the channel.

With $\mu'(V)=0$, an equation for $\gamma$ is derived as $$\gamma = \frac{\int_0^{\phi_{sL}-\phi_{s0}} \{\mu(\phi_s)(-2\alpha(\phi_s)\alpha')\}^2 d\phi_s}{\mu^2(1-\alpha^2)(-2\alpha')} \qquad (13)$$

$$= \frac{28}{105}\left\{\frac{(1+3\alpha+6\alpha^2)\mu_d^2 + (3+4\alpha+3\alpha^2)\mu_d\mu_s + (6+3\alpha+\alpha^2)\mu_s^2}{(\mu_d+\mu_s)^2(1+\alpha)}\right\}$$

where $\mu$ is the average carrier mobility of the carrier mobility $\mu_s$ at the source terminal and the carrier mobility $\mu_d$ at the drain terminal.

Obviously, there is no need to set $\mu'(V)=0$.

Note, however, that equation (13) given above represents the optimal value of $\gamma$, and the present invention is not limited to the value of $\gamma$ itself expressed by equation (13) because a satisfactory function and effect can be obtained even with a slight difference or error within an allowable range, i.e., within the scope of this model.

In this case, when the drain voltage enters the saturation region, $\alpha=0$. In addition, in the case of a long channel, since $\mu_d \approx \mu_s$, the value of $\gamma$ obviously converges to ⅔.

Figure 4:
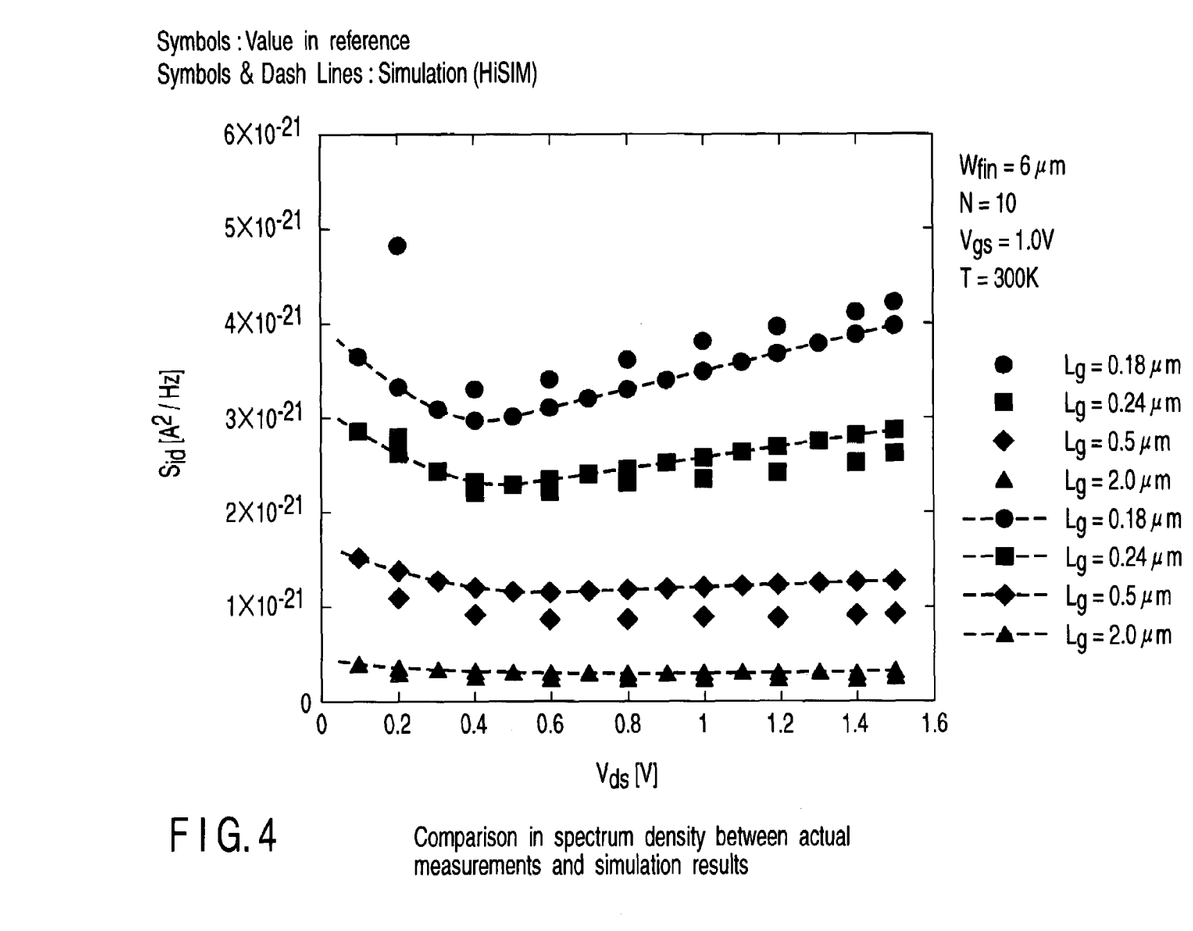
FIG. 4 is a graph showing a comparison between the actual measurements and the drain-source voltage and current spectrum density as simulation results according to the embodiment of the present invention.

FIG. 4 shows the result obtained by comparing the values obtained by conversion to current spectrum densities by using this value of $\gamma$ with the actual measurements reported in A. J. Scholten et. al, IEDM 2002, "Compact modeling of drain and gate current noise for RF CMOS". As is obvious from FIG. 4, the calculation results obtained by using HiSIM are very similar to the values in the above reference which are thought to be highest in reliability. Obviously, this model has no fitting parameters, although HiSIM reproduces actually measured current-voltage characteristics.

Figure 5:
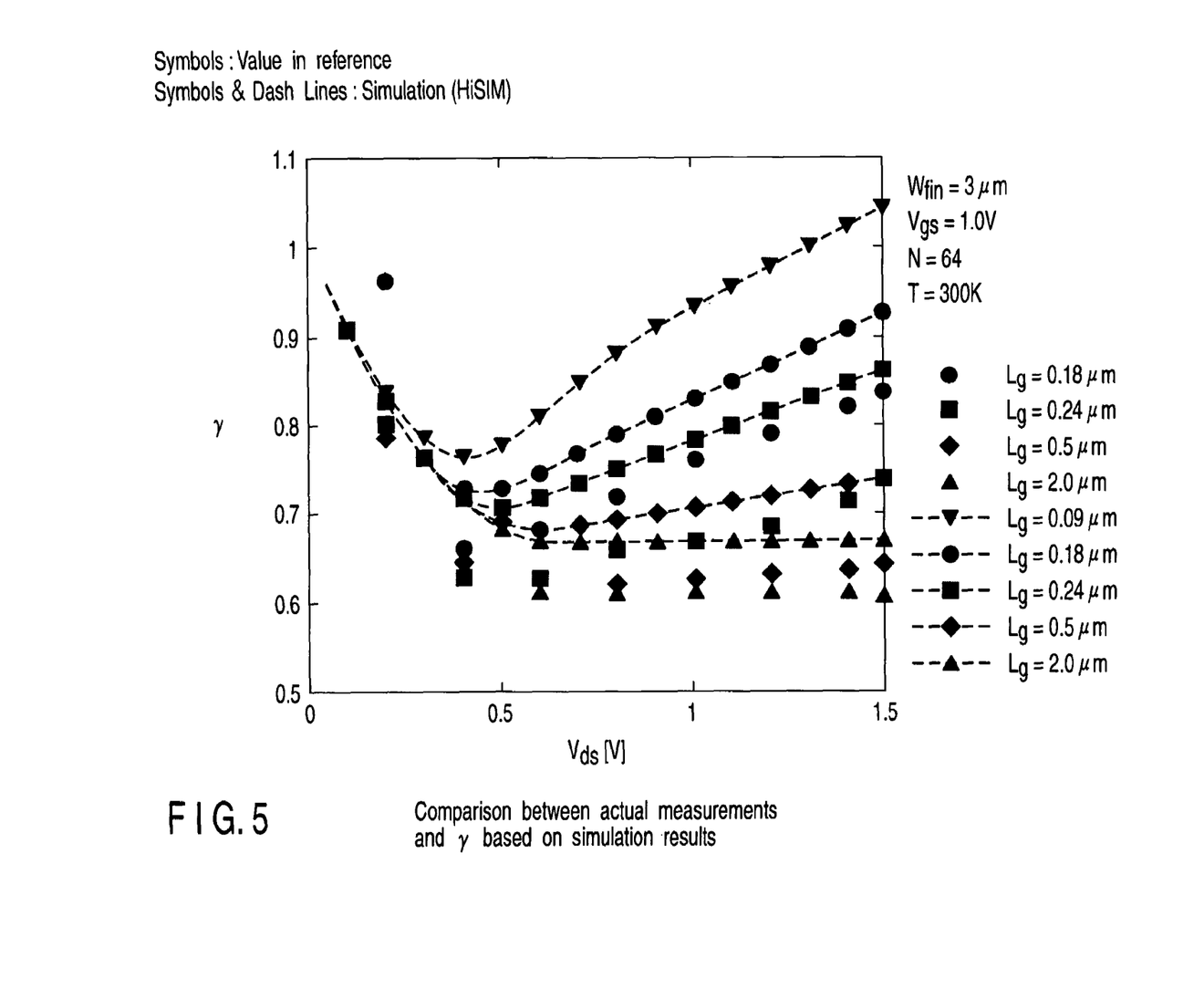
FIG. 5 is a graph showing a comparison between the actual measurements and the drain-source voltage and thermal drain noise coefficient as simulation results according to the embodiment of the present invention.

FIG. 5 shows a comparison between the simulation results and the values obtained converting the spectrum density in the reference into $\gamma$ so as to set $\gamma=1$ when $V_{ds}=0$.

FIG. 5 shows a comparison between the actual measurements and $\gamma$ calculated by a simulation model of thermal noise according to the embodiment of the present invention. Since the model values are very similar to the actual measurements, when this model is used, simulation of thermal noise can be performed with high precision with respect to all operating voltages by using the Nyquist theorem equation and a drain current Ids of a modified surface potential model without actually measuring thermal noise. This makes it possible to accurately perform noise simulation of an analog circuit without using any measurement result on thermal noise.

In addition, as shown in FIG. 5, the tendency of $\gamma$ also properly reproduces the actual measurements. In the case of a short channel, as indicated by the actual measurements as well, the value of $\gamma$ showed a tendency to increase after decreasing once with respect to a change in drain voltage unlike the past reports. In addition, the minimum value of $\gamma$ showed a tendency to increase with a decrease in channel length.

Taking only a change in carrier mobility within a channel makes it possible to reproduce the tendency that the value of $\gamma$ increases with a decrease in channel length even without any consideration of the influence of the hot carrier effect proposed in the conventional theory.

In addition, in the case of a long channel, a tendency could be reproduced in which when the drain voltage enters the saturation region based on the theory, the value of $\gamma$ converges to ⅔. In the case of a short channel, the result revealed that the value of $\gamma$ did not increase from the actual measurement in the reference as much as thought it would. In this case, it was found that the value of $\gamma$ tended to increase after decreasing once with an increase in drain voltage.

In addition, according to this model, in either the case of a short channel or the case of a long channel, the tendencies of both spectrum density and $\gamma$ can be properly expressed by comparing the actual measurements in the reference and simulation results. This embodiment can even evaluate a measurement result on thermal noise. That is, a measurement result can be analyzed by using the thermal drain noise coefficient γ.

Thermal drain noise can be predicted with high precision from the DC characteristics of a MOSFET by using the MOSFET model generated on the basis of the above speculation without measuring noise under different bias conditions or performing approximation using fitting parameters.

Representing $V_{th}$ and δ as indicated by equations (11) and (12) given above makes it possible to calculate thermal drain noise in the entire bias region, thus realizing circuit simulation.

The simulation method and apparatus using the above MOSFET model will be described next with reference to FIGS. 6 and 7. A simulation model HiSIM will be exemplified as a surface potential model. A case wherein the above simulation model (MOSFET model) for the design of a semiconductor device, which is used to estimate thermal drain noise, is incorporated in HiSIM will be described below.

Figure 6:
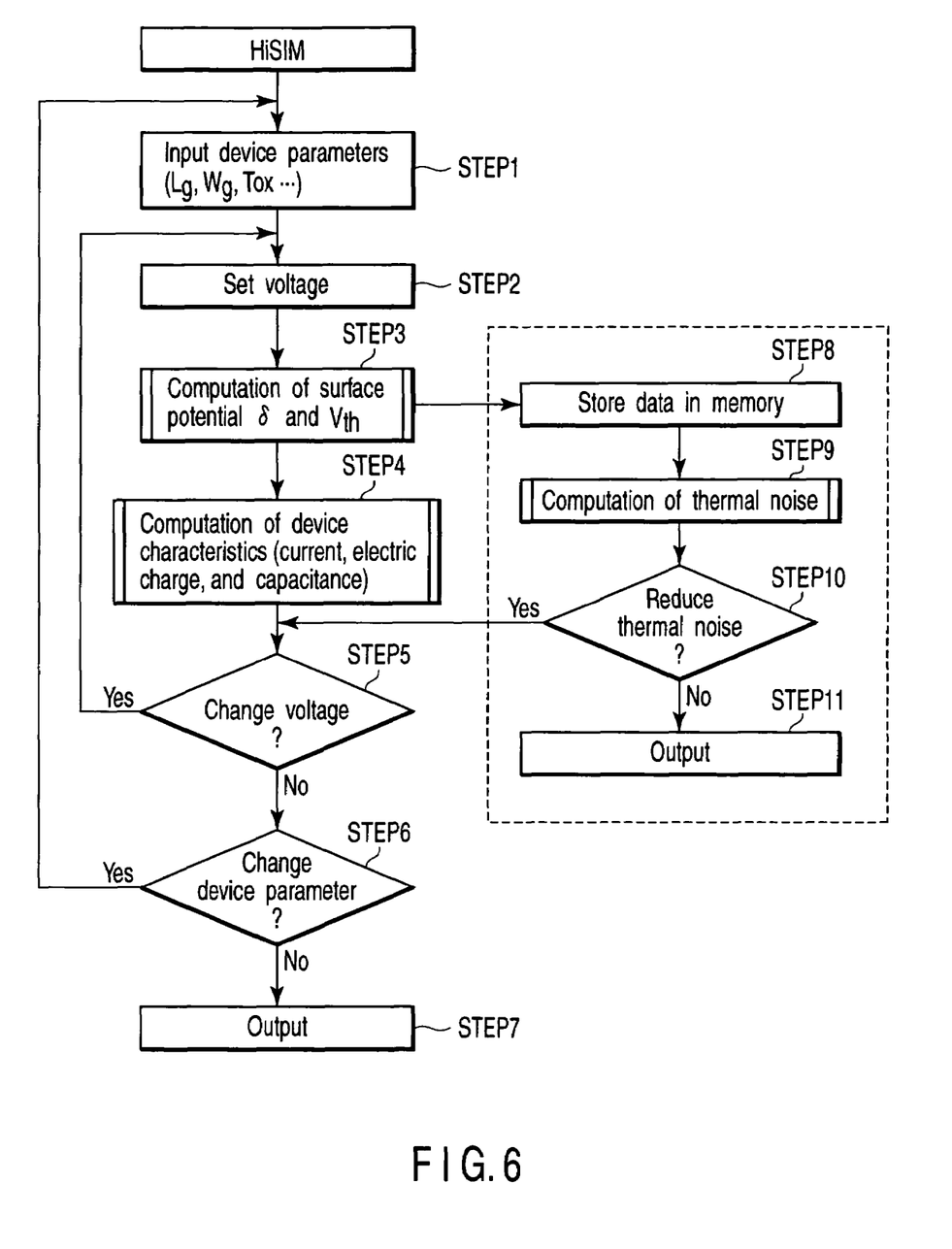
FIG. 6 is a flowchart showing a simulation method for a semiconductor device according to the embodiment of the present invention.

FIG. 6 is a flowchart showing a simulation method for a semiconductor device according to the embodiment of the present invention. FIG. 7 is a block diagram showing the schematic arrangement of the simulation apparatus. In the flowchart shown in FIG. 6, STEP 1 to STEP 7 are processing steps for basic simulation operation of HISIM. STEP 8 to STEP 11 enclosed with the broken line are processing steps for calculating and outputting thermal drain noise.

Figure 7:
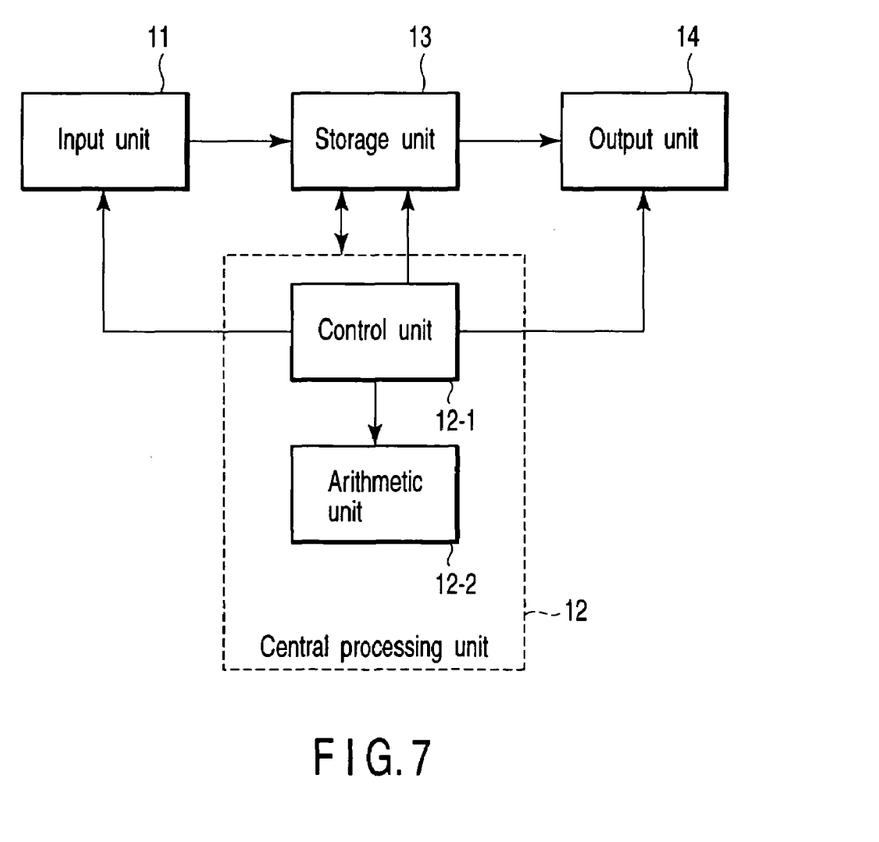
FIG. 7 is a block diagram showing the schematic arrangement of a semiconductor device simulation apparatus according to the embodiment of the present invention.

As shown in FIG. 7, the simulation apparatus is comprised of an input unit 11 such as a keyboard or operation panel, a central processing unit 12 which performs various processes, a storage unit 13 such as a storage circuit, semiconductor memory, or hard disk, and an output unit 14 such as a display unit or printer. The central processing unit 12 comprises a control unit 12-1 and arithmetic unit 12-2. The control unit 12-1 controls the operations of the input unit 11, arithmetic unit 12-2, storage unit 13, output unit 14, and the like. The following are written and stored as programs in the storage unit 13: an operational expression for a surface potential or threshold voltage, an operational expression for device characteristics, an operational expression for the drain current of a MOSFET in HiSIM, a relational expression for the drain current noise spectrum density obtained from a Nyquist theorem equation, and an operational expression for a thermal drain noise coefficient.

As indicated by the flowchart of FIG. 6, after various device parameters such as gate length $L_g$, gate width $W_g$, gate oxide film thickness $T_{OX}$, and the like of a MOSFET are input from the input unit 11 (STEP 1), a voltage to be applied to the MOSFET is set (STEP 2). The device parameters and voltage setting data input from the input unit 11 are stored in the storage unit 13 under the control of the control unit 12-1 in the central processing unit 12.

The device parameters, voltage setting data, and the operational expressions for a surface potential and threshold voltage stored in the storage unit 13 are transferred to the arithmetic unit 12-2, and the surface potential δ, threshold voltage $V_{th}$, and the like are computed under the control of the control unit 12-1 (STEP 3). The computation results are transferred to the storage unit 13 and stored therein (STEP 8).

Device characteristics are then computed by using the calculated surface potential δ and threshold voltage $V_{th}$ in addition to the device parameters, the voltage setting data, the operational expression for device characteristics, and the like stored in the storage unit 13 (STEP 4). With this operation, current, electric charge, capacitance, and the like are calculated.

The central processing unit 12 determines, on the basis of the data and computation results stored in the storage unit 13, whether or not to change the set voltage (STEP 5). If the voltage is to be changed, the flow returns to STEP 2 to change the voltage setting, and the operation in STEP 3 to STEP 5 is performed. The operation in STEP 2 to STEP 5 is then repeated until it is determined that the voltage is not changed.

In contrast to this, if it is determined that the voltage is not to be changed, the central processing unit 12 determines again, on the basis of the data and computation results stored in advance in the storage unit 13, whether or not to change a device parameter (STEP 6). If it is determined that the device parameter is to be changed, the flow returns to STEP 1 to change the device parameter setting and perform the operation in STEP 2 to STEP 6. The operation in STEP 1 to STEP 6 is repeated until it is determined that the device parameter is not to be changed.

If it is determined in STEP 6 that the device parameter is not to be changed, a simulation result is output from the output unit 14 under the control of the central processing unit 12 (STEP 7).

The device parameters and voltage setting data input in STEP 1 and STEP 2 and the data of the computation results on the surface potential δ and threshold voltage $V_{th}$ stored in the storage unit 13 in STEP 8 are transferred to the arithmetic unit 12-2, and the above thermal noise computation is performed on the basis of the operational expression for a drain current, the relational expression for a drain current noise spectrum density obtained from the Nyquist theorem equation, and the operational expression for a thermal drain noise coefficient for the MOSFET in the surface potential model (HiSIM in this case) which are stored in the storage unit 13 (STEP 9). The central processing unit 12 then determines from this thermal noise computation result whether or not to reduce thermal noise (STEP 10). If it is determined that the thermal noise is to be reduced, the flow returns to STEP 5 as an HiSIM processing routine to reflect the determination in the simulation. If it is determined that the thermal noise is not to be reduced, the computation result is output from the output unit 14 under the control of the control unit 12-1 (STEP 11).

According to the above arrangement and method, the electrical characteristics and circuit operation of a semiconductor device formed from microfabricated MOSFETs can be accurately and quickly simulated by performing simulation using the above MOSFET model.

A semiconductor device with little thermal drain noise can therefore be manufactured by adjusting various device parameters and set voltages in MOSFETs while reflecting this MOSFET model and a simulation result in device design.

In the above simulation method and apparatus, the present invention is applied to HiSIM as an example of a surface potential model. Obviously, however, the present invention can be applied to other surface potential models in general.

The simulation model for the design of a semiconductor device according to the present invention can be used as a device model in the design of an electronic circuit such as an IC or LSI. This model is suitable for a MOSFET model for a microfabricated circuit used in the GHz band, in particular.

The analysis method and the simulation method and apparatus using this model can predict and analyze thermal drain noise with high precision from the DC characteristics of a MOSFET. Furthermore, a semiconductor device with little thermal drain noise can therefore be manufactured by adjusting various device parameters and set voltages in MOSFETs while reflecting a simulation result in device design.

As described above, according to one aspect of this invention, there is provided a simulation model for the design of a semiconductor device which can accurately estimate thermal drain noise with respect to all operating voltages from the DC characteristics of a MOSFET.

A thermal drain noise analysis method which can analyze a measurement result by using the thermal drain noise coefficient γ of the above model can be provided.

A simulation method and apparatus which can accurately simulate the electrical characteristics or circuit operation of a semiconductor device on a computer by predicting thermal drain noise by using the above model can be provided.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device simulation method comprising:
a first step of inputting a device parameter for a MOSFET;
a second step of setting a voltage for the MOSFET;
a third step of computing a surface potential and a threshold voltage of the MOSFET on the basis of the device parameter input in the first step and the set voltage input in the second step,
a fourth step of computing a device characteristic of the MOSFET on the basis of the calculated surface potential and threshold voltage;
a fifth step of determining whether or not to change a voltage setting in the MOSFET; and
a sixth step of determining whether or not to change the device parameter for the MOSFET,
the third to fifth steps being repeated upon returning to the second step to change the voltage setting when it is determined in the fifth step that the voltage setting is to be changed, and
the second to sixth steps being repeated upon returning to the first step to change the device parameter when it is determined in the fifth step that the voltage setting is not to be changed and it is determined in the sixth step that the device parameter is to be changed,
the semiconductor device simulation method further comprising:
a seventh step of storing, in storage means, the surface potential and threshold voltage obtained by computation in the third step;
an eighth step of computing thermal drain noise on the basis of data of the device parameter input in the first step, the set voltage input in the second step, and the surface potential and threshold voltage stored in the storage means; and
a ninth step of determining whether or not to reduce thermal drain noise in the MOSFET, and transferring a computation result of thermal drain noise to the fifth step to reflect the result in thermal noise simulation using the model when it is determined that the thermal drain noise is to be reduced,
the eighth step including calculating a drain current $I_{ds}$ of a MOSFET by using a surface potential model according to the following equations based on a drift-diffusion approximation:

$$I_{ds} = \frac{W_g}{L_{eff}} \mu C_{OX} \frac{(V_{gs} - V_{th})^2}{2(1+\delta)}(1 - \alpha^2)$$

where $W_g$ is a gate width of the MOSFET, "$L_{eff}$-$L_{red}$" is a distance from a source terminal to a pinch-off point, μ is a carrier mobility, $C_{OX}$ is a capacitance of a gate oxide film per unit area, $V_{gs}$ is a gate-source voltage, $V_{th}$ be a threshold voltage, $\phi_{s0}$ is a surface potential at a source terminal in a channel, $\phi_{sL}$ is a surface potential at a drain terminal in the channel, and δ is a bulk coefficient, $$\alpha = 1 - \frac{1+\delta}{V_{gs} - v_{th}}(\phi_{SL} - \phi_{SO})$$

and substituting the calculated drain current $I_{ds}$ into the following relational expression for a thermal drain noise spectrum density which is obtained from a Nyquist theorem equation:

$$S_{id} = \frac{4kT}{L_{eff}^2 I_{ds}} \int g_{ds}^2(\phi_s) d\phi_s$$

where k is a Boltzmann constant, T is an absolute temperature, $L_{eff}$ is an effective channel length of the MOSFET, $g_{ds}$ is a channel conductance, and $\phi_s$ is a silicon surface potential, thereby calculating a thermal drain noise coefficient γ of the MOSFET, $$\gamma = \frac{\int g_{ds}^2(\phi_s) d\phi_s}{L_{eff}^2 * I_{ds} * g_{ds0}}$$

repeatedly changing the voltage setting in the MOSFET on the basis of the calculated device characteristic and the calculated thermal drain noise, and performing computation of the device characteristic and computation of the thermal drain noise, and
estimating thermal drain noise by repeating computation while changing the device parameter.

2. A semiconductor device simulation apparatus comprising:
input means for inputting a device parameter and a set voltage;
processing means for performing computation of a surface potential and a threshold voltage, computation of a device characteristic, and computation of thermal drain noise on the basis of the device parameter and set voltage input from the input means;
storage means for storing the device parameter and set voltage input from the input means, a program describing an operational expression for a drain current of a MOSFET in a surface potential model, a program describing a relational expression for a thermal drain noise spectrum density which is obtained from a Nyquist theorem equation, a program describing an operational expression for a thermal drain noise coefficient, and a computation result obtained by the processing means, and output means for outputting the computation result obtained by the processing means, wherein in computing thermal drain noise, the processing means calculates a drain current $I_{ds}$ in accordance with the program which describes the following equations based on a drift-diffusion approximation using the surface potential model and is stored in the storage means to compute a drain current of the MOSFET:

$$I_{ds} = \frac{W_g}{L_{eff} - L_{red}} \mu C_{ox} \frac{(V_{gs} - V_{th})^2}{2(1+\delta)}(1-\alpha^2)$$

where $W_g$ is a gate width of the MOSFET, "$L_{eff}$-$L_{red}$" is a distance from a source terminal to a pinch-off point, μ is a carrier mobility, $C_{OX}$ is a capacitance of a gate oxide film per unit area, $V_{gs}$ is a gate-source voltage, $V_{th}$ be a threshold voltage, $\phi_{s0}$ is a surface potential at a source terminal in a channel, $\phi_{sL}$ is a surface potential at a drain terminal in the channel, and δ is a bulk coefficient, $$\alpha = 1 - \frac{1+\delta}{V_{gs} - v_{th}}(\phi_{SL} - \phi_{S0}), \text{ and}$$

substitutes the calculated drain current $I_{ds}$ into the program which describes the following relational expression for a thermal drain noise spectrum density which is obtained from a Nyquist theorem equation and is stored in the storage means:

$$S_{id} = \frac{4kT}{Leff^2 I_{ds}} \int g_{ds}^2(\phi_s) d\phi_s$$

where k is a Boltzmann constant, T is an absolute temperature, $L_{eff}$ is an effective channel length of the MOSFET, $g_{ds}$ is a channel conductance, and $\phi_s$ is a silicon surface potential, so as to perform computation, and substitutes the drain current $I_{ds}$ into the program which describes a thermal drain noise coefficient γ of the MOSFET $$\gamma = \frac{\int g_{ds}^2(\phi_s) d\phi_s}{L_{eff}^2 * I_{ds} * g_{ds0}}$$

so as to perform computation, thereby calculating the thermal drain noise coefficient γ.

* * * * *